(12) United States Patent
Pritchard et al.

(10) Patent No.: US 7,409,670 B1
(45) Date of Patent: Aug. 5, 2008

(54) SCHEDULING LOGIC ON A PROGRAMMABLE DEVICE IMPLEMENTED USING A HIGH-LEVEL LANGUAGE

(75) Inventors: J. Orion Pritchard, Santa Cruz, CA (US); Todd Wayne, Soquel, CA (US)

(73) Assignee: Altera Corporation, San Jose, CA (US)

( * ) Notice: Subject to any disclaimer, the term of this patent is extended or adjusted under 35 U.S.C. 154(b) by 63 days.

(21) Appl. No.: 10/993,572

(22) Filed: Nov. 16, 2004

Related U.S. Application Data

(63) Continuation-in-part of application No. 10/816,685, filed on Apr. 1, 2004.

(51) Int. Cl.
*G06F 17/50* (2006.01)
(52) U.S. Cl. .............................. 716/17; 716/3; 716/18; 710/23; 711/100; 712/23
(58) Field of Classification Search .................. 716/3–6, 716/11, 16, 18, 21; 713/322, 323; 712/34, 712/43; 710/22, 104; 707/200; 703/13, 703/14, 16, 17, 19, 22
See application file for complete search history.

(56) References Cited

U.S. PATENT DOCUMENTS

| | | | | |
|---|---|---|---|---|
| 5,479,355 A * | 12/1995 | Hyduke | ...................... | 703/14 |
| 5,937,179 A * | 8/1999 | Swoboda | ..................... | 716/16 |
| 6,052,773 A * | 4/2000 | DeHon et al. | ................. | 712/43 |
| 6,223,274 B1 * | 4/2001 | Catthoor et al. | ............... | 712/34 |
| 6,282,706 B1 * | 8/2001 | Chauvel et al. | ............ | 717/150 |
| 6,308,234 B1 * | 10/2001 | Davies et al. | ............... | 710/104 |
| 6,339,836 B1 * | 1/2002 | Eisenhofer et al. | ............. | 716/5 |
| 6,393,433 B1 * | 5/2002 | Kalavade et al. | ........... | 707/200 |
| 6,421,251 B1 | 7/2002 | Lin | | |
| 6,466,898 B1 * | 10/2002 | Chan | ........................... | 703/17 |
| 6,467,075 B1 | 10/2002 | Sato et al. | | |
| 6,625,587 B1 * | 9/2003 | Erten et al. | .................... | 706/22 |
| 6,651,225 B1 * | 11/2003 | Lin et al. | ....................... | 716/4 |
| 6,658,578 B1 | 12/2003 | Laurenti et al. | | |
| 6,754,763 B2 * | 6/2004 | Lin | ............................. | 710/317 |
| 6,766,460 B1 * | 7/2004 | Evoy et al. | ................. | 713/323 |
| 6,775,763 B2 | 8/2004 | Sexton et al. | | |
| 6,785,873 B1 * | 8/2004 | Tseng | ........................... | 716/4 |
| 6,810,442 B1 * | 10/2004 | Lin et al. | ...................... | 710/22 |
| 6,871,341 B1 * | 3/2005 | Shyr | ......................... | 717/131 |

(Continued)

OTHER PUBLICATIONS

Peter Clarke, "Celoxica adds simulator, debugger to Handel -C Compiler" www.EETimes.com, Jan. 30, 2001, 3 pages.

(Continued)

*Primary Examiner*—Stacy A Whitmore
*Assistant Examiner*—Helen Rossoshek
(74) *Attorney, Agent, or Firm*—Weaver Austin Villeneuve & Sampson LLP

(57) ABSTRACT

Methods and apparatus are provided for implementing a programmable device including a processor core, a hardware accelerator, and secondary components such as memory. A portion of a program written in a high-level language is automatically selected for hardware acceleration. Dedicated ports are generated to allow the hardware accelerator to handle pointer referencing and dereferencing. A hardware accelerator is generated to perform pipelined processing of instructions. The number of stages implemented for pipelined processing is at least partially dependent on the latency associated with accessing secondary components.

30 Claims, 12 Drawing Sheets

U.S. PATENT DOCUMENTS

| | | | |
|---|---|---|---|
| 6,877,150 | B1 | 4/2005 | Miller et al. |
| 6,912,706 | B1 | 6/2005 | Stamm et al. |
| 6,930,689 | B1 * | 8/2005 | Giacalone et al. ............ 345/502 |
| 6,952,816 | B2 * | 10/2005 | Gupta et al. .................... 716/18 |
| 6,993,731 | B2 * | 1/2006 | Whitaker et al. ................. 716/3 |
| 7,003,746 | B2 * | 2/2006 | Hyduke et al. ................... 716/4 |
| 7,027,972 | B1 * | 4/2006 | Lee ............................... 703/22 |
| 7,089,539 | B2 | 8/2006 | Dornan et al. |
| 7,120,858 | B2 | 10/2006 | Zak et al. |
| 7,120,895 | B2 * | 10/2006 | Ye et al. ......................... 716/21 |
| 7,162,591 | B1 | 1/2007 | Miranda et al. |
| 7,185,293 | B1 | 2/2007 | Ofer |
| 7,203,799 | B1 | 4/2007 | Ball |
| 7,260,798 | B2 * | 8/2007 | Gupta et al. ..................... 716/5 |
| 2002/0133325 | A1 * | 9/2002 | Hoare et al. .................... 703/17 |
| 2002/0152060 | A1 * | 10/2002 | Tseng ........................... 703/17 |
| 2002/0193893 | A1 * | 12/2002 | Li et al. .......................... 700/94 |
| 2003/0093254 | A1 * | 5/2003 | Frankel et al. ................. 703/13 |
| 2003/0171908 | A1 * | 9/2003 | Schilp et al. ................... 703/16 |
| 2003/0233221 | A1 * | 12/2003 | O'Brien et al. ................ 703/23 |
| 2004/0015739 | A1 * | 1/2004 | Heinkel et al. ................. 714/37 |
| 2004/0123258 | A1 * | 6/2004 | Butts ............................... 716/5 |
| 2004/0130927 | A1 * | 7/2004 | Schulz et al. ................ 365/145 |
| 2004/0194046 | A1 * | 9/2004 | Singhal et al. ................. 716/11 |
| 2005/0034002 | A1 * | 2/2005 | Flautner ...................... 713/322 |
| 2005/0081170 | A1 * | 4/2005 | Hyduke et al. ................... 716/6 |
| 2005/0228630 | A1 * | 10/2005 | Tseng et al. .................... 703/19 |
| 2005/0278680 | A1 | 12/2005 | Mukherjee et al. |

OTHER PUBLICATIONS

Mentor Graphics Corporation, HDL Designer Series Data sheet, www.mentor.com, May 2003, 4 pages.

Accel Chip, AccelChip Technical Overview, Accelerating the process of chip design, www.accelchip.com, Mar. 2004, 22 pages.

Peter Clarke, "Synthesis and reconfigurable startups team around Matlab", www.EETimes.com, Aug. 20, 2002, 1 page.

Richard Goering, "Advances in system-level design roll out", www.EETimes.com, May 19, 2003, 4 pages.

U.S. Appl. No. 10/816,685, Office Action dated Jun. 4, 2007.

U.S. Appl. No. 11/238,451, Office Action mailed Jun. 4, 2007.

U.S. Appl. No. 10/816,685, Office Action dated Apr. 21, 2006.

U.S. Appl. No. 10/816,685, Final Office Action dated Sep. 26, 2006.

Hauck et al., "The roles of FPGA's in reprogrammable systems", Jan. 20, 1998 Google search.

Amira et al., "An FPGA based accelerator for discrete Hartley and fast hadamard transforms", 2003, IEEE int'l Midwest Symposium, vol. 2, pp. 860-863.

Wageeh et al., "FPGA based accelerator for functional simulation", 2004, Circuits and Systems, ISCAS '04, Int'l Symposium, vol. 5, pp. 317-320.

Darte et al., "Hardware/software interface for multi-dimensional processor arrays", 2005, IEEE Int'l Conference, pp. 28-35.

U.S. Appl. No. 10/816,685, filed Apr. 1, 2004.

U.S. Appl. No. 11/238,451, filed Sep. 28, 2005.

U.S. Appl. No. 11/238,451, Notice of Allowance mailed Oct. 15, 2007.

U.S. Appl. No. 11/238,451, Allowed claims as of Oct. 15, 2007.

U.S. Appl. No. 10/816,685, Notice of Allowance mailed Dec. 18, 2007.

U.S. Appl. No. 10/816,685, Allowed Claims as of Dec. 18, 2007.

* cited by examiner

SCHEDULING LOGIC ON A PROGRAMMABLE DEVICE IMPLEMENTED USING A HIGH-LEVEL LANGUAGE

CROSS REFERENCE TO RELATED APPLICATIONS

This application is a Continuation-in-part of now abandoned application Ser. No. 10/816,685 filed on Apr. 1, 2004, and entitled "GENERATING COMPONENTS ON A PROGRAMMABLE DEVICE USING A HIGH-LEVEL LANGUAGE", by inventors Pritchard et al., the disclosure of which is incorporated herein by reference.

BACKGROUND OF THE INVENTION

1. Field of the Invention

The present invention relates to programmable chips. In one example, the present invention relates to methods and apparatus for using a high-level programming language to implement a programmable chip.

2. Description of Related Art

A number of benefits have spurred efforts towards developing programmable chips having both logic elements and a processor core. In one example, integrating processor cores with logic elements on a single programmable chip allows efficient and effective processing using a variety of different logic mechanisms and functions. In one example, programmable chips are provided with not only logic elements and memory, but with processor cores and other components as well. Integrating processor cores and other components onto a programmable chip allow designers to more efficiently implement descriptions on programmable devices by allowing some functions to be performed by a processor core and other functions to be performed using logic elements and hardware acceleration.

Some mechanisms for implementing a processor core entail using a general purpose programming language or high level language. In one example, code written in a general purpose programming language such as C or C++ is converted into a hardware descriptor language (HDL) file using a tool such as the DK1 Design Suite available from Celoxica Corporation of Abingdon, England. The HDL file can then be synthesized and implemented on a programmable chip such as a programmable logic device (PLD) or a field programmable gate array (FPGA). Some available synthesis tools are Leonardo Spectrum, available from Mentor Graphics Corporation of Wilsonville, Oreg. and Synplify available from Synplicity Corporation of Sunnyvale, Calif.

However, mechanisms for efficiently optimizing processor cores from a high level language on programmable devices are limited. It is therefore desirable to provide improved methods and apparatus for optimizing implementation of processor cores on programmable chips.

SUMMARY OF THE INVENTION

Methods and apparatus are provided for implementing a programmable device including a processor core, a hardware accelerator, and secondary components such as memory. A portion of a program written in a high-level language is automatically selected for hardware acceleration. Dedicated ports are generated to allow the hardware accelerator to handle pointer referencing and dereferencing. A hardware accelerator is generated to perform pipelined processing of instructions. The number of stages implemented for pipelined processing is at least partially dependent on the latency associated with accessing secondary components.

In one embodiment, high-level language code configured to run on a conventional central processing unit is used to generate hardware acceleration logic. The hardware acceleration logic is configured to perform pipelined execution of instructions using multiple execution stages. In some examples, the hardware acceleration logic is coupled to a secondary component such as memory. The number of execution stages depends at least partly on the expected latency of secondary components including memory. In one example, the number of execution stages is equal to the maximum latency of secondary components in clock cycles.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
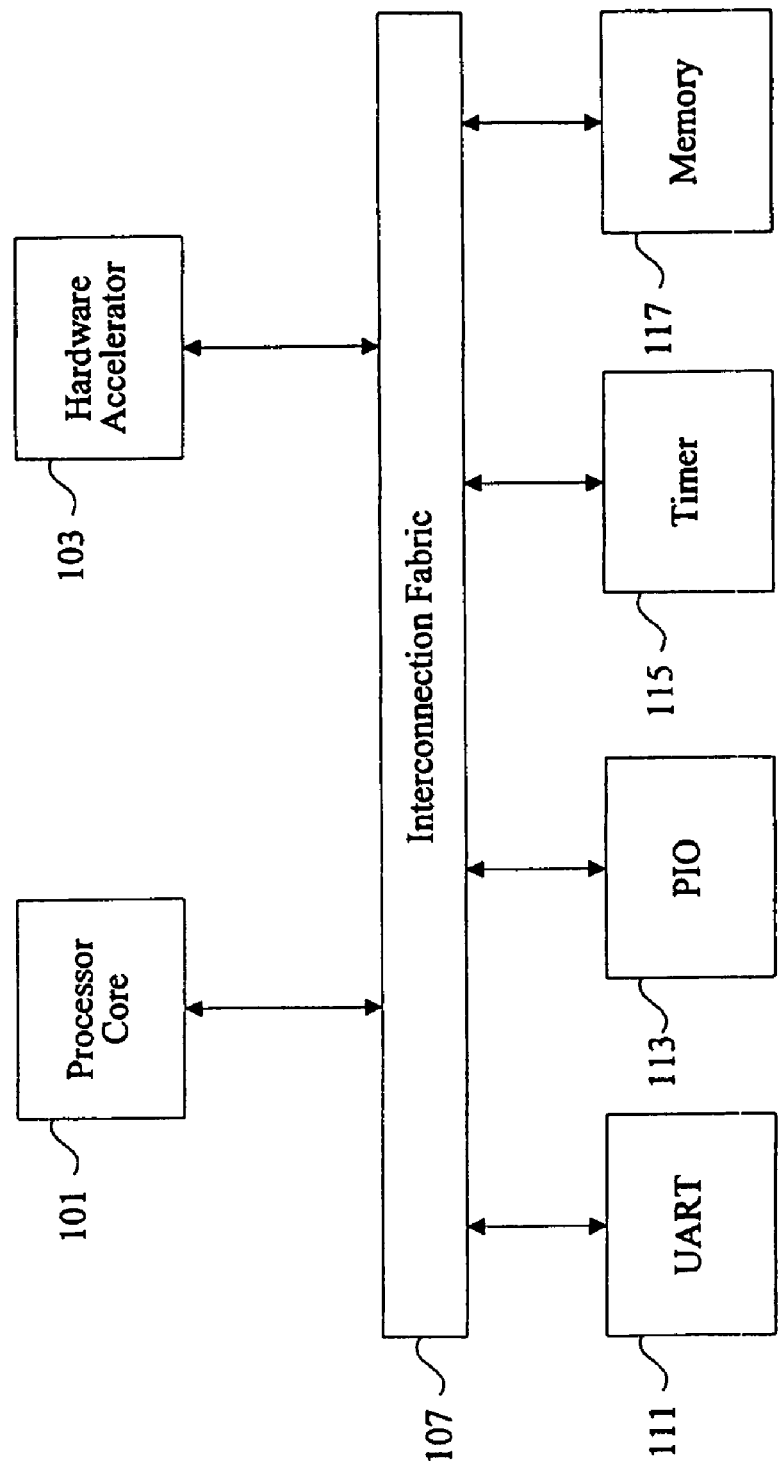
FIG. 1 is a diagrammatic representation showing a programmable device.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. For example, the techniques of the present invention will be described in the context of particular processors and memory.

However, it should be noted that the techniques of the present invention can be applied to a variety of types of devices. In the following description, numerous specific details are set forth in order to provide a thorough understanding of the present invention. The present invention may be practiced without some or all of these specific details. In other instances, well known process operations have not been described in detail in order not to unnecessarily obscure the present invention. Furthermore, techniques and mechanisms of the present invention will sometimes be described in singular form for clarity. However, it should noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

A variety of systems can be implemented on a programmable device having both logic elements and a processor core. In one example, a computer with a processor core, memory, local area network (LAN) interface, and a universal asynchronous receiver transmitter (UART) can be collected on a single programmable device such as an FPGA. The programmable device can also include customized logic for performing specialized functions for optimizing a particular application. In one example, logic elements are allocated for implementing a digital signal processing (DSP) core for performing Fast Fourier Transform (FFT) operations. In another example, logic elements are allocated for optimizing video rendering functions.

Designers have a variety of options available for implementing a system on a programmable device. In typical instances, the designer provides both a hardware and a software design. A hardware design can be used to implement a particular hardware accelerator on the programmable device. Software can run on a general-purpose processor included on the device. Any logic or mechanisms supporting a general-purpose instruction set such as a reduced instruction set computing (RISC) instruction set, a complex instruction set computing (CISC), or a very long instruction word (VLIW), instruction set is referred to herein as a general-purpose processor or a central processing unit. Conventional processors include the Xeon line of processors available from Intel Corporation of Santa Clara, Calif. and the Opteron line of processors available from AMD of Sunnyvale, Calif. Conventional processing cores available for implementation on a system on a chip (SOC) or a system on a programmable chip (SOPC) include the ARM line of processor cores available from ARM Ltd. of Cambridge, England.

A system on a programmable chip typically includes logic implemented using a Hardware Description Language (HDL). However, using HDL may not be a very efficient or effective way of optimizing an application optimized programmable chip. HDL often requires knowledge about the underlying hardware, and relatively few people have familiarity with HDL.

Other languages for implementing logic on a device have been developed based on high-level programming languages. Any language that can be used to describe software functions and/or objects without extensive knowledge of the underlying hardware used to implement the software is referred to herein as a high-level language. Examples of high-level languages include C, C++, Java, and Pascal conventionally used by software engineers. Other variations include Matlab and VisualBasic. High-level languages are typically general purpose and interact with hardware using operating system associated application program interfaces (APIs).

The high level language includes mechanisms for implementing function calls. The high level language description is compiled into a generic sequential flow by parsing, building a symbol table, and generating a generic sequential flow using typical compiler techniques. Some tools including HDL Designer available from Mentor Graphics Corporation of Wilsonville, Oreg. and the DK1 Design Suite available from Celoxica of Abingdon, England provide high-level language like syntax, typically C-like syntax, for implementing a portion of a program in hardware while leaving the rest as a software implementation. However, tools that provide high-level language like syntax for implementing hardware on a programmable device have significant drawbacks.

One tool providing C-like syntax is Celoxica's DK1 Design Suite that uses a language referred to as Handel-C. Although Handel-C looks like C to a software engineer, there are significant differences. In order to use Handel-C, a software engineer has to go through extra training about hardware-specific concepts such as clock cycles, parallelism, and bit widths. When a software engineer wants to implement specific code using hardware acceleration, the engineer is required to determine what portion should be accelerated. Even determining what to accelerate often requires knowledge of the underlying hardware. The software engineer then typically has to make specific hardware calls in a portion of the program. One or more lines of software code are referred to herein as a portion of a software program. In one example, a portion includes separate blocks of code in different files of the same program. Consequently, a program written in Handel-C can not operate on any other system. For example, a Handel-C program can not be run completely using a general purpose processor such as an ARM processor core, as the ARM processor core would not understand hardware acceleration function calls.

High-level language tools use special syntax such as bitwise vector operations or parallel constructs in order to allow for hardware acceleration. The special syntax makes the high-level language programs incompatible with conventional processor cores. For example, the high-level language may require the placement of the term "parallel" in front of lines of code designated for hardware acceleration. Many high-level language tools also place limits on the use of memory. In some instances, the only memory that can be used is internal programmable device memory. No off-chip memory can be used.

Furthermore, high-level language tools have very poor pointer support. Read and write accesses to specific memory addresses conventionally are not easily implemented in hardware. Although a central processing unit (CPU) may have access to a specific address 0xFF3823, hardware accelerators usually do not have access the memory lines that the CPU has access to. Hardware accelerators typically have access to only a portion of memory, e.g. 0x00FF00 to 0x010000. A hardware accelerator can not be easily configured to access a memory line outside of its allocated address space. Consequently, to support hardware acceleration code involving pointers, complex sequences of memory copies are used. Repeatedly copying various memory lines can be extremely inefficient and often eliminates the advantage of using hardware acceleration in the first place.

Consequently, the techniques of the present invention allow the conversion of portions of high-level language programs into hardware without requiring any modifications to the underlying program. Pointer referencing and dereferencing is robust, while being handled automatically without user intervention. The techniques of the present invention allow the implementation of high-level language programs onto a variety of devices.

FIG. 1 is a diagrammatic representation showing one example of a system on a programmable chip that can be implemented using high-level language programs. The system includes a processor core, a hardware accelerator, peripheral devices, and peripheral interfaces. Peripheral devices and peripheral interfaces are herein referred to as components. The system on a programmable chip includes processor core 101 and a hardware accelerator 103 as well as peripheral components UART 111, PIO 113, timer 115, and data memory 117. In some examples, the hardware accelerator 103 is a Digital Signal Processing (DSP) core, a cryptography accelerator, or a video processor. It should be noted that the system can include both on-chip memory 117 and off-chip memory. In one example, the data memory 117 can support variable latency or fixed latency access. The components are interconnected using an interconnection fabric 107. Any mechanism or logic for connecting components in a system is referred to herein as an interconnection fabric. In one example, the interconnection fabric is a bus. In another example, the interconnection fabric is a secondary side arbitration fabric.

The programmable chip uses different types of resources that can be interchangeably used in different allocations to implement the system on a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

The techniques and mechanisms of the present invention allow the implementation of a system on a programmable chip from a high-level language program. In one example, variable latency and fixed latency can be supported on a system using a conventional bus architecture.

Figure 2:
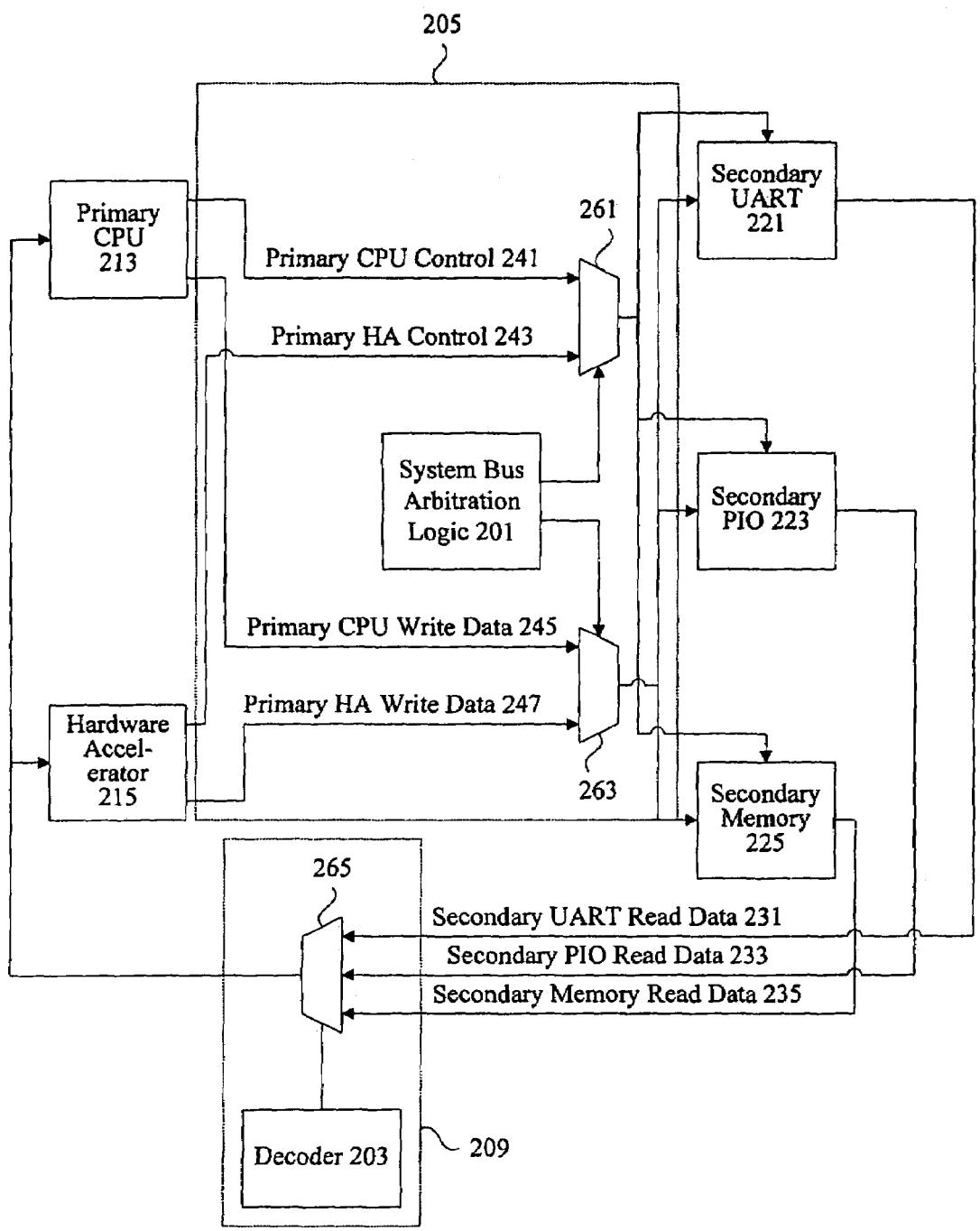
FIG. 2 is a diagrammatic representation showing a conventional bus architecture.

FIG. 2 is a diagrammatic representation depicting a hardware accelerator coupled to a microprocessor in a system using a conventional bus architecture. Although the techniques of the present invention provide significant performance benefits on a system having a secondary component side arbitration, the techniques can also be used to implement other systems such as conventional system bus implementations. A high-level language program can be used to generate a system having a conventional system bus.

A conventional bus architecture includes a system bus arbitrator 205. A system bus arbitrator 205 includes arbitrator switching circuitry 261 and 263 as well as system bus arbitration logic 201. Logic and mechanisms for selecting an input based on a control signal are referred to herein as arbitrator switching circuitry. It should be noted that although switching circuitry generally can be implemented using multiplexers, a variety of mechanisms including switches and transistors can be used.

Any component or device that is operable to initiate read and write operations by providing control information is referred to herein as a primary component. Primary components are sometimes referred to as master components. Control information can include a particular address associated with a secondary component. Any component or device that responds to read or write operations with information sent back to the primary component regarding the read or write operation is referred to herein as a secondary component. Secondary components are sometimes referred to as slave components. Some examples of primary components are processors, microcontrollers, and Ethernet devices. Some examples of secondary components are Universal Asynchronous Receiver Transmitters (UARTs), Parallel Input Output (PIO), program memory, and data memory. It should be noted that some components such as an Ethernet component can be both a primary component and a secondary component, as an Ethernet component has the capability of reading and writing to the secondary program memory while also responding to instructions from a primary system CPU.

Logic and mechanisms for providing the control signal based on criteria such as fairness or priority are referred to herein as arbitration logic. The inputs of the arbitrator switching circuitry 261 and 263 are connected to primary CPU 213 and hardware accelerator 215. The outputs of the arbitrator switching circuitry 261 and 263 are connected to secondary UART 221, secondary PIO 223, and secondary peripheral interface 225. The outputs of the secondary components transmit information such as read data back to the primary components through a decoder 209. Mechanisms for selecting secondary components and translating control information such as addresses are referred to herein as a decoder. In conventional computer systems, there is a single decoder for each bus. A decoder 209 includes decoder logic 203 and decoder switching circuitry 265 for selecting the particular secondary component data transfer. A decoder can also be referred to as a primary side arbitrator including primary side arbitration logic and primary side switching circuitry.

A system bus typically has a set width (e.g. 64 bits, 128 bits) and allows only one primary component to actively use the bus at any one time. In conventional systems, only one primary component can access any one of the given secondary components at any given time. Multiple primary components accessing secondary components in a manner that would cause data bit collisions if performed on the same data lines is referred to herein as accessing secondary components at the same time.

In one example, a hardware accelerator is accessing a secondary PIO. While the hardware accelerator is accessing the secondary PIO, a processor can not access an SDRAM through a peripheral interface even if both the primary streaming output device and the peripheral interface are available.

The system bus arbitration logic 201 determines which primary component has access to the system bus at any time. The system bus arbitrator 201 can determine which primary component can access a secondary component based on criteria such as fairness or priority. Any component or device that is configured to ensure that only one primary component can access any one of the secondary components at any given time is referred to herein as a system bus arbitrator. Various schemes such as weighted fairness can be implemented to improve the efficiency of secondary component access, but such schemes can increase system complexity and latency. In conventional implementations, a computer system includes a single system bus arbitrator for each bus in the computer system.

According to various embodiments of the present invention, it is recognized that a bus is no longer required in certain applications such as system on a chip, system on a programmable chip, and other computer system implementations. A device such as a programmable logic device (PLD) or a field programmable gate array (FPGA) using a hardware descriptor language (HDL) is herein referred to as a programmable chip or a programmable device. Instead of implementing complicated bus sharing schemes using mechanisms such as splitting, the bus itself can be eliminated to improve system performance.

According to specific embodiments, it is recognized that primary components and secondary components need not be routed through a construct such as a bus. By not routing signals through a bus, a streaming output device can be implemented in a much more efficient manner. The conventional data and address lines that make up the bus are no longer the resource in contention. Instead, secondary components are resources in contention, as the number of physical lines connected to each secondary component in a system can be fixed. Furthermore, by not using a bus, interconnection flexibility is enhanced. For example, a hardware accelerator can be allocated a variety of ports for directly accessing a memory and the only resource in contention would be the memory.

Consequently, a system bus arbitrator associated with all the secondary components in a computer system is no longer needed. Instead, secondary components themselves that may be accessed by more than one primary component are assigned individual secondary side arbitrators. An arbitrator that corresponds to a specific secondary component accessible by more than one primary component is referred to herein as a secondary side arbitrator. In one embodiment, there is a secondary side arbitrator for each secondary component in a computer system. In other embodiments, there is a secondary side arbitrator for selected secondary components in a system. The techniques of the present invention recognize that hardware accelerator support for high-level language programs can be more efficiently and effectively provided in a system by using secondary side arbitration.

Figure 3:
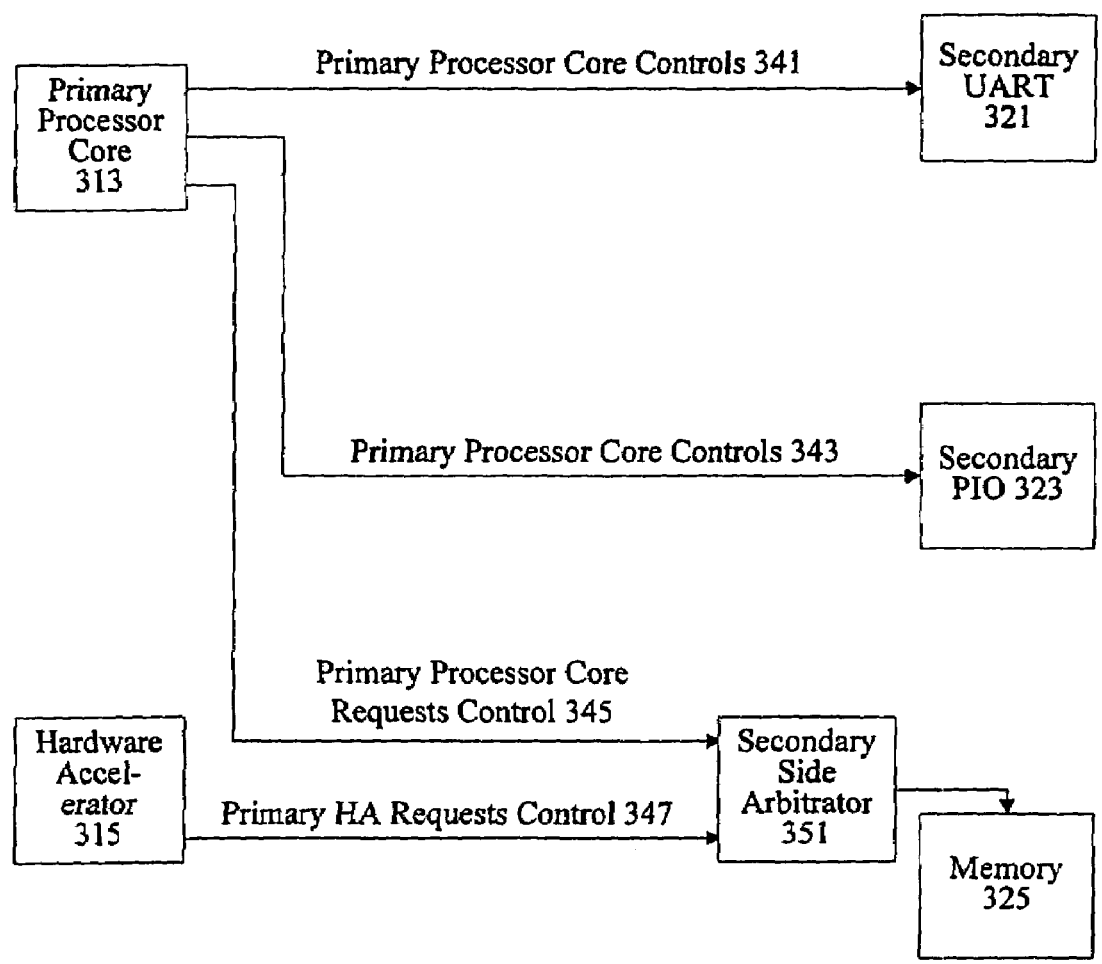
FIG. 3 is a diagrammatic representation showing an interconnection fabric.

FIG. 3 is a diagrammatic representation showing one example of a system using secondary side arbitration, sometimes referred to as slave side arbitration, simultaneous multiple primary components, or simultaneous multiple masters. A system using individual arbitrators that correspond to individual secondary components accessible by more than one primary component is referred to herein as a secondary side arbitration system. The secondary side arbitration system no longer requires a bus or a system bus arbitrator that prevents a second primary component from accessing a second secondary component when a first primary component is accessing a first secondary component. According to various embodiments, a secondary component such as peripheral interface 325 is associated with a secondary side arbitrator 351. However, secondary components UART 321 and PIO 323 are not associated with any arbitrator. In one example, secondary component UART 321 and secondary PIO 323 can only be accessed by primary CPU 313 and not by primary Ethernet device 315. A secondary memory component 325, however, can be accessed by both primary CPU 313 and primary Ethernet device 315.

According to various embodiments, a secondary side arbitrator 351 allows a first secondary component in a system to be accessed by a first primary component at the same time a second secondary component in the system is accessed by a second primary component. For example, peripheral interface 325 can be accessed by primary Ethernet 315 through secondary side arbitrator 351 at the same time, secondary UART 321 is accessed by primary CPU 313.

By allowing a CPU to access a secondary component at the same time another primary component such as a streaming output device or an Ethernet component is accessing memory, bus bottlenecks can be reduced. By using the simultaneous multiple primary component architecture, more direct connections between components can also be supported.

Figure 4:
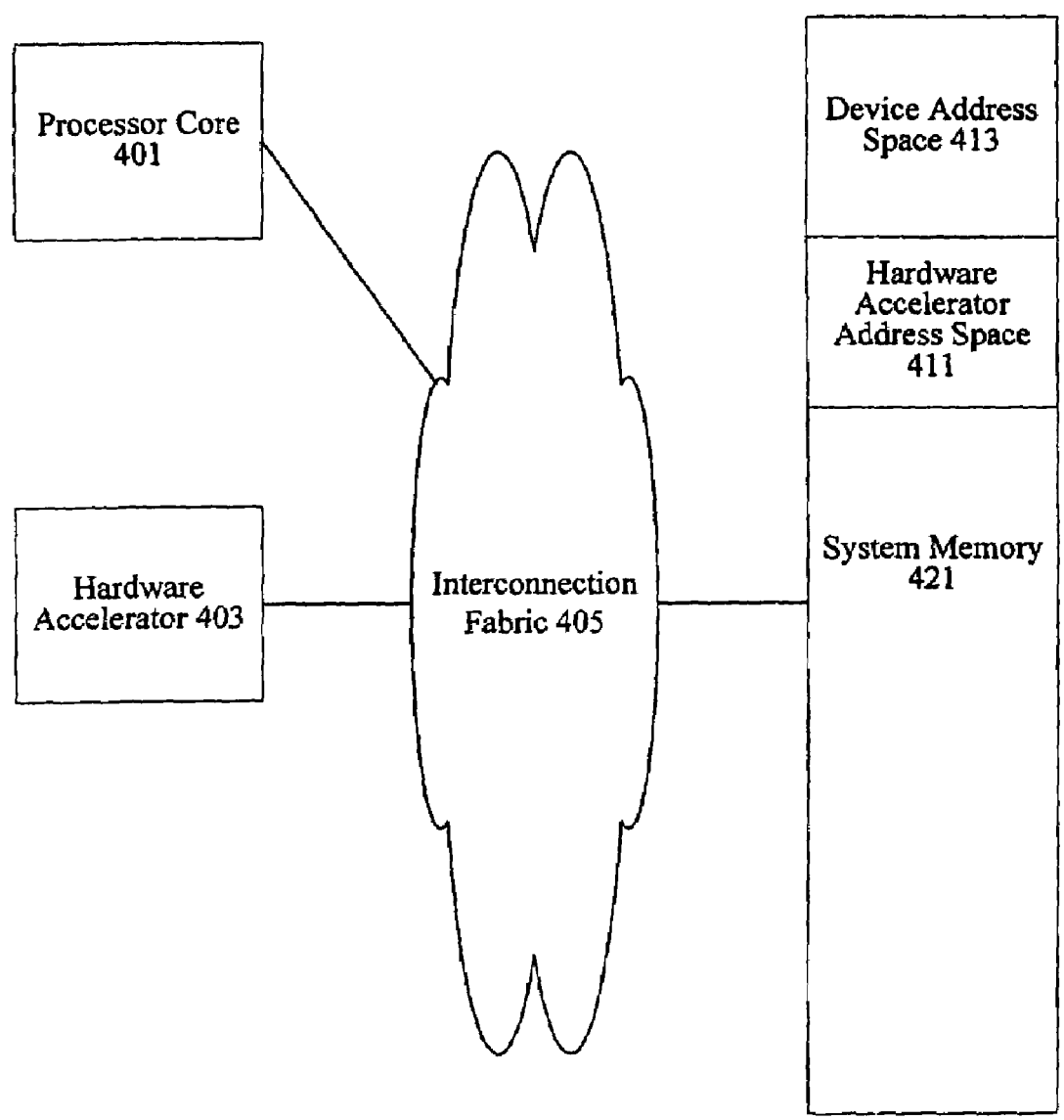
FIG. 4 is a diagrammatic representation depicting components and a system memory map.

FIG. 4 is a diagrammatic representation showing an example of an address map associated with a programmable device processor core. A processor core 401 and a hardware accelerator 403 are coupled to a system memory 421 through an interconnection fabric 405. In one example, the interconnection fabric 405 is a system bus. In another example the interconnection fabric 405 is a simultaneous multiple primary component fabric. A processor core 401 has access to the address space associated with system memory 421. A portion of system memory 421 is allocated for devices. In one example, a portion 411 is allocated to the hardware accelerator as a hardware accelerator address space and a portion 413 is allocated to other devices in the system.

When a hardware accelerator performs a read or write operation, the read or write operation can only occur for memory lines within the portion 413. In many conventional systems, a processor core 401 has access to the entire system memory address space. When pointers are used in the software program, read and write requests are often directed at specific memory addresses. For example, a pointer with an address 0xFF0D may be the target of a write operation. To perform the write, the processor core 401 accesses the address 0xFF0D in the system memory 421 address space.

However, other devices such as hardware accelerator 403 may only have access to a portion of system memory. In one example, a hardware accelerator 403 is a DSP core that is provided with access only to hardware accelerator address space 411. In many conventional systems, a high-level language program could not easily be hardware accelerated because of problems with pointer referencing and dereferencing. For example, if a write to the address 0xFF0D is to be performed by a hardware accelerator 403, the hardware accelerator 403 should have direct access to the address 0xFF0D. However, in many instances the hardware accelerator 403 does not have access to addresses associated with pointers. Consequently, conventional mechanisms for implementing a programmable device with hardware acceleration from a high-level programming language could either not handle pointers or had to handle pointers in a very obtuse fashion. In one example, pointers simply could not be included as a target of hardware acceleration. Pointers would be handled strictly in software by a processor core.

In another example, complex logic would be wrapped around the pointer access. A hardware accelerator would first forward the request to a processor to obtain access to a pointer associated line in memory. The pointer associated with the line in memory would then be copied into the address space accessible by the hardware accelerator. All of this memory copying is highly inefficient, and typically removes any added efficiency advantages obtained by using hardware acceleration. Similarly, off-chip memory lines would similarly have to be copied into the address accessible by the hardware accelerator. Typical hardware accelerators are only allocated a portion of the available memory space to prevent accelerators from interfering with system operation. In one example, a hardware accelerator and the rest of a computer system are built by separate designers. System code may be written in a portion of memory accessible only by a processor core to prevent stray writes by a hardware accelerator into system code. Stray writes or reads may corrupt system operation.

However, the techniques of the present invention allow a system and a hardware accelerator to be configured efficiently and effectively by the same designer. According to various embodiments, the hardware accelerator is generated as a system is generated, based on a description provided by a designer. Consequently, the mechanisms of the present invention can allow a hardware accelerator to access the same address space to which a processor has access. Concerns with either inadvertent or malicious system corruption are reduced. The techniques of the present invention can allow more robust pointer handling, as the techniques of the present invention provide hardware accelerator ports configured for handling pointer referencing and dereferencing. In typical instances, pointer referencing and dereferencing is not possible without providing a hardware accelerator with access to much of the address space.

Figure 5:
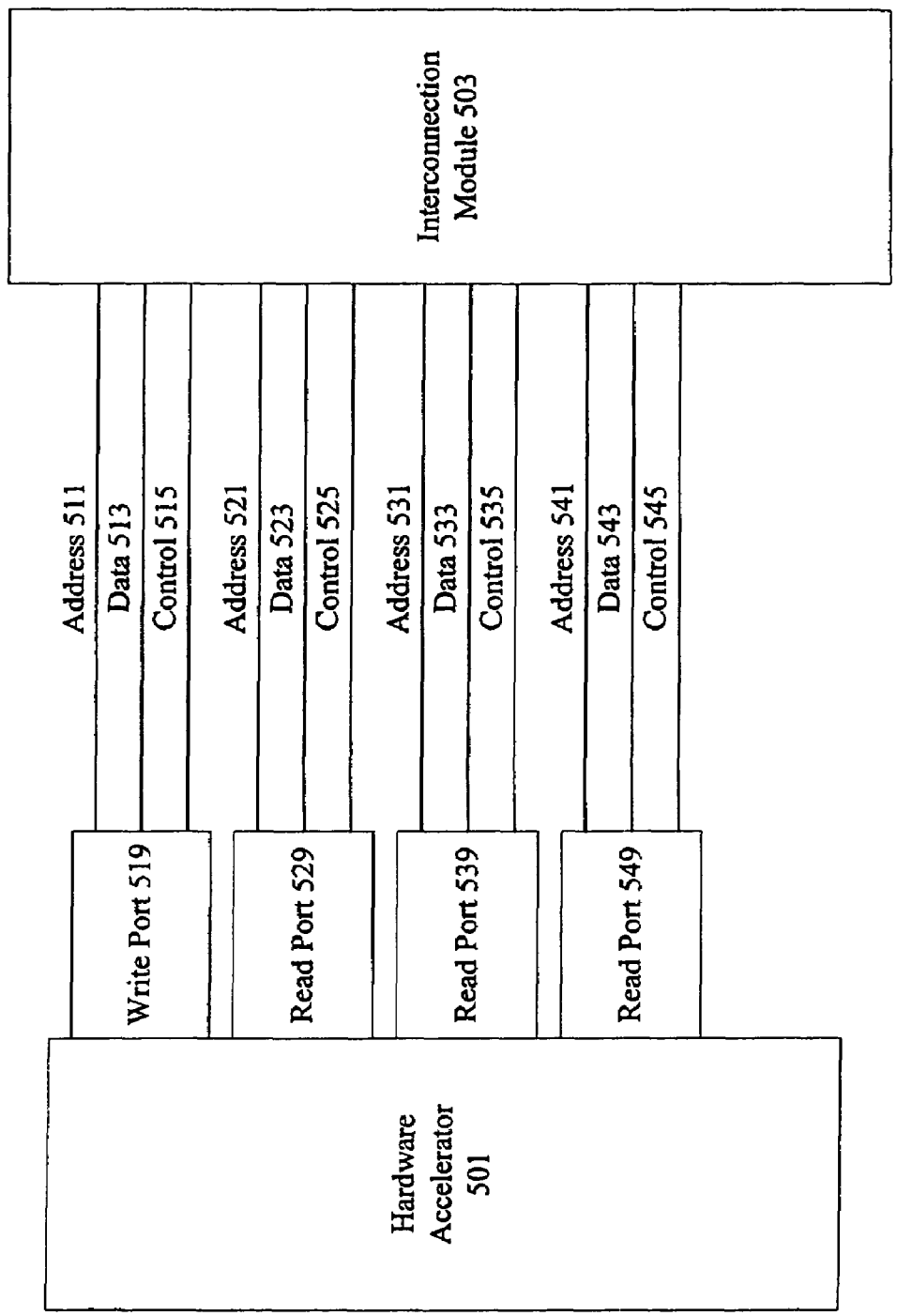
FIG. 5 is a diagrammatic representation depicting generated ports for handling pointer reads and writes.

FIG. 5 is a diagrammatic representation of one example of a hardware accelerator having associated read and write ports for handling pointer referencing and dereferencing. According to various embodiments, a number of read ports 529, 539, and 549 as well as a write port 519 are provided with the hardware accelerator 501. In one example, the write port 519 is provided for each pointer write identified in a hardware accelerated portion of a high-level language program. For example, if code to be implemented on a hardware accelerator includes a write to a pointer having an address 0x80D356, a write port configured to write data to this particular address is provided. In some examples, if writes to pointers having 10 different addresses are included in high-level language program code, 10 different write ports each configured with a corresponding address are configured for the hardware accelerator 501. To handle a pointer write to an address 0x80D356, the address line 511 is configured to maintain this particular address when the hardware accelerator 501 is supplemented. To implement the pointer write, the write port having an address 0x80D356 is selected. In one example, the address line is 511. Data to be written is provided on data line 513. One or more control lines may also be used.

The hardware accelerator 501 may also include other write ports associated with other pointer addresses or may include write ports not configured with any specific address. The techniques of the present invention provide an interconnection module 503 and allows a hardware accelerator 501 to have a large number of write ports without substantially affecting system performance. In conventional systems, a hardware accelerator 501 would have a limited number of write ports. In one example, a hardware accelerator having a large number of write ports in a system bus architecture would have a negative impact on system performance. According to various embodiments, the interconnection module 503 provides connections between a primary component such as a hardware accelerator 501 and a secondary component using a secondary side arbitrator. Consequently, a large number of write ports can be arbitrator using secondary side arbitration without having to go through a bus bottlenecks.

By using generated ports to handle pointer writes, techniques of the present invention can robustly handle pointer referencing and dereferencing in a manner that does not substantially affect system performance. According to various embodiments, the hardware accelerator 501 is no longer limited to a portion of the device address space allocated by a processing core. The hardware accelerator 501 can have access to the entire memory address space of a system CPU. That is, the hardware accelerator 501 has access to be same addresses to which the system processor core has access. In order to perform a write to address 0x446D88, the data value does not first have to be copied into the address space allocated to the hardware accelerator 501. Instead, a write port having address 0x446D88 can be provided to handle this pointer write. If the hardware accelerated portion of the high-level language program also includes a write to address 0xFF56DA, a write port having 0xFF56DA as the address can also be provided. Read ports can similarly be used to handle pointer reads. For example, pointer read addresses can be configured for address lines 521, 531, and 541 to allow data to be read on data lines 523, 533, and 543 using control lines 525, 535, and 545.

Figure 6A:
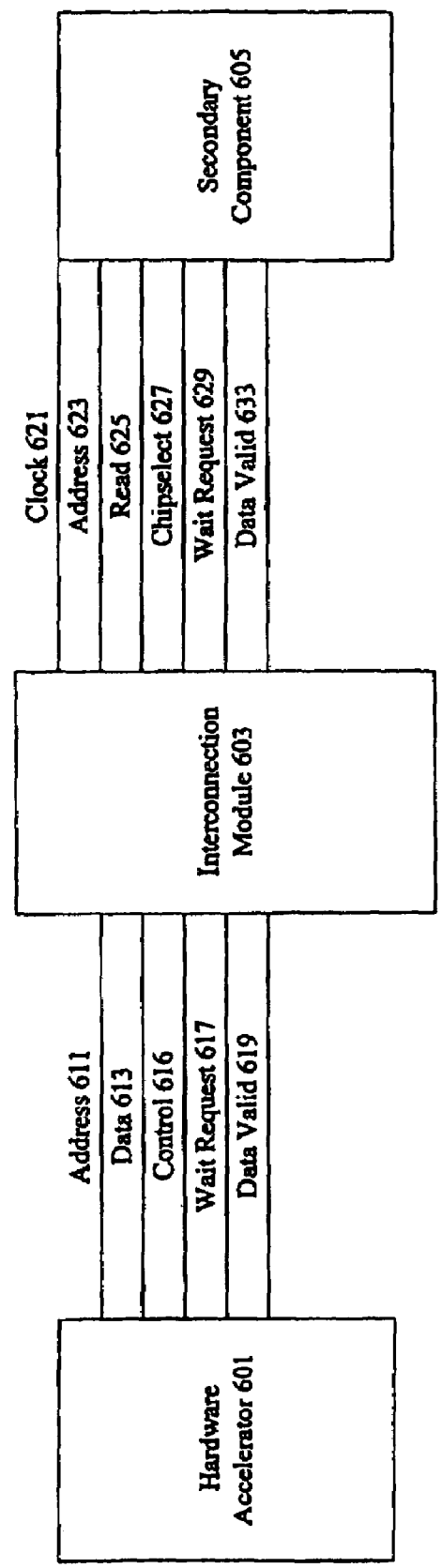
FIG. 6A is a diagrammatic representation showing an interconnection module and associated ports.

FIG. 6A is a diagrammatic representation showing one example of a port used to handle a pointer write. The write port couples a hardware accelerator 601 to a secondary component 605 through an interconnection module 603. According to various embodiments, the write port includes address 611, data 613, control 615, and wait request lines 617. Address 611, data 613, control 615, and wait request lines 617 couple the hardware accelerator 601 and an interconnection module 603. The wait request line 617 is used to indicate when a primary component should wait. An interconnection module 603 also routes clock lines 621, address lines 623, read lines 625, chip select lines 627, and wait request lines 629 to a secondary component 605. A read data line 631 is routed from the secondary component 605 to the interconnection module 603.

In one example, a first bus cycle starts on the rising edge of clock line 621. A hardware accelerator 601 provides an address 0xFF56DA over address line 611. Address 623 and read 625 from the interconnection module 603 to the secondary component 605 are set to valid. The interconnection module 603 decodes the address and asserts chipselect 627. In some examples, the secondary component 605 asserts waitrequest 629 before the next rising edge of clock 621. The interconnection module 603 samples waitrequest 629 at the rising edge of clock 621. The waitrequest is forwarded to hardware accelerator 601 along waitrequest line 617. When a secondary component provides valid read data 625, the secondary component deasserts waitrequest 629. The interconnection module 603 then captures the read data 625 and forwards the data on data line 613.

It should be noted that the architecture can also be used to support variable latency with the addition of a data valid line. Any mechanism used to indicate to a primary component that data is available from a secondary component is referred to herein as a data valid line. In some examples, a data valid line is used indicate when data is available for reading from a memory buffer. When data is available, the secondary component drives a valid read data to indicate that it can accept another pending read transfer.

Accessing a secondary component such as memory through an interconnection module typically takes multiple clock cycles before a response is returned. In many instances, secondary component access such as memory access is a system performance limiting factor. Consequently, the techniques of the present invention provide mechanisms for keeping a secondary component busy with requests. In one example, downstream logic can be scheduled based on the expected latency of memory access. Knowing the expected memory latency allows the request pipe to be kept full. According to various embodiments, the expected latency is set as the maximum latency associated with accessing any slave component.

In one example, the secondary component with the highest latency is a secondary component having a maximum latency of 10 clock cycles. In some examples, a hardware accelerator is then generated with support for instructions with 10 stage pipelines. That is, up to 10 instructions will be in execution during any single clock cycle. The data path can be separated into up to 10 stages. For example, data path stages for typical systems including instruction fetch, instruction decode, register file read, address calculation, etc. In other examples, instructions with 5 stage pipelines are provided when a memory has a latency of 10 clock cycles.

Figure 6B:
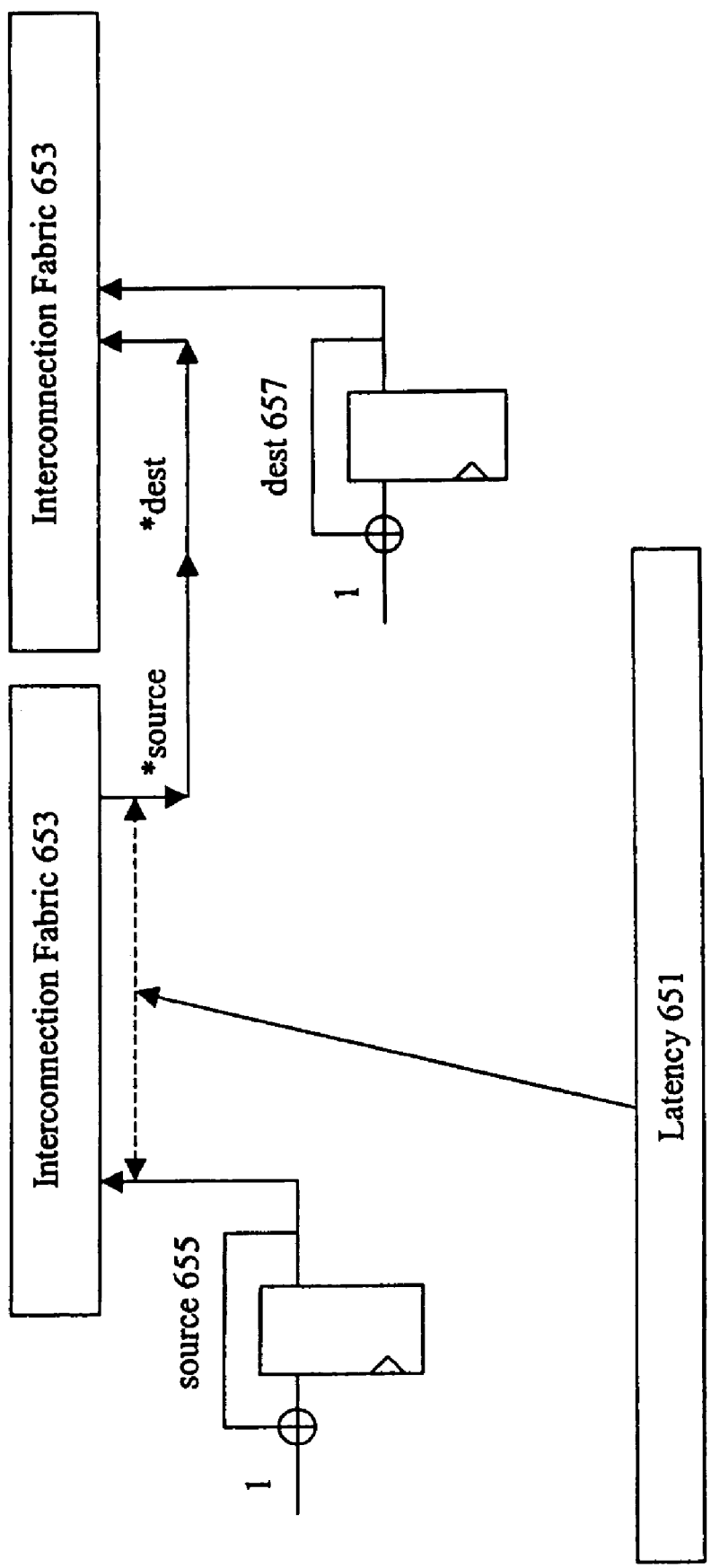
FIG. 6B is a diagrammatic representation showing pipelined operation of a primary component based on the access latency of a secondary component.

FIG. 6B is a diagrammatic representation showing a generated component. In this Direct Memory Access (DMA) example, a source 655 sends a request over an interconnection fabric 653 such as a bus or a simultaneous multiple primary component fabric. The latency is determined by using the maximum secondary component latency. In one example, the following high-level language code can be selected for hardware acceleration. The following code can be implemented as noted in FIG. 6B:

```
void dma (char* dest, char* source, unsigned int count)
{
  do {
    *dest++=*source++;
  } while (count--);
}
```

Figure 6C:
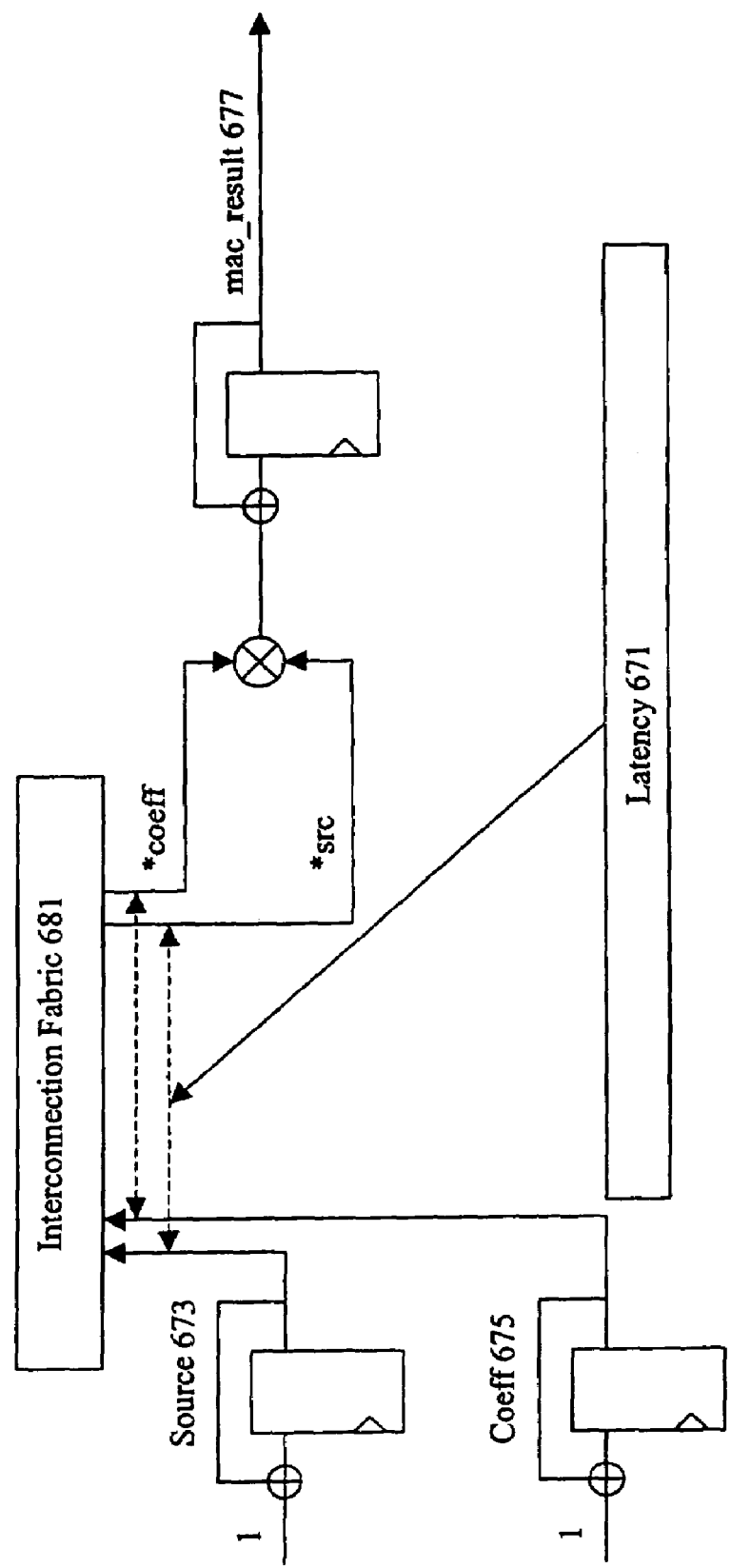
FIG. 6C is a diagrammatic representation showing MAC operations based on memory access latency.

In another example, multiple registers can also be accessed as shown in a Media Access Control (MAC) component example depicted in FIG. 6C. The following code can be implemented in FIG. 6C.

```
unsigned int dma (char* src, char* coeff, unsigned int
   count)
{
  unsigned int mac_result=0;
  do {
    mac_result +=*src++* *coeff;
  } while (count--);
  return mac_result;
}
```

Values are requested for source 673 and coefficient 675 over an interconnection fabric. Latency for the return of the coefficient value and the source value is determined by the maximum secondary component latency. The values can then be multiplied to provide a result 677.

In some examples, responses may be returned sooner than a maximum secondary component latency. Consequently, a buffer is provided to hold the results until the hardware accelerator acquires the value. In some example, the buffer is sized so that is can hold data for a number of clock cycles equal to the maximum secondary component latency in clock cycles.

Figure 7:
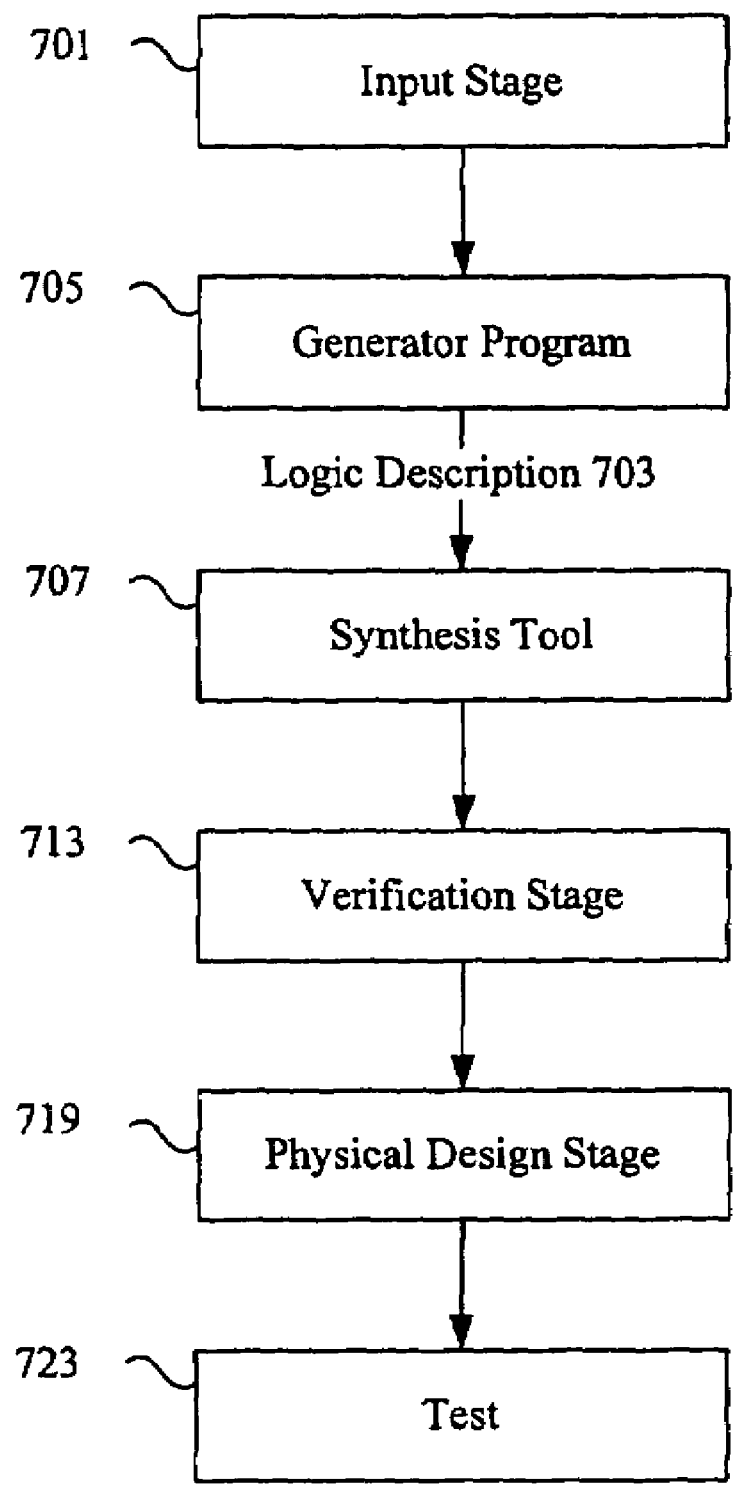
FIG. 7 is a diagrammatic representation showing a technique for implementing the programmable chip.

FIG. 7 is a flow process diagram showing one example of a technique for implementing a programmable chip. At 701, primary components such as processor cores, Ethernet components, DMA controllers, etc., are identified for implementation on the programmable device. At 703, secondary components including peripherals such as memory components are identified. At 705, an interconnection component is generated. In one example, a bus fabric along with bus arbitration logic is generated. In another example, a simultaneous multiple primary component interconnection fabric is generated. At 707, data, address, and control lines are arranged to connect the primary and secondary components through the interconnection module. In one example, address, data, control, wait request, clock, and chip select lines are generated to allow communication between primary and secondary components. At 709, data valid lines are also provided. In some instances, data valid lines are referred to as included in the set of control lines. A data valid line allows a secondary component to indicate to a primary component that data is available.

In some embodiments, a primary component posts a read to the secondary component, and if a wait request is not signaled, the primary component is free to access other secondary components while waiting for the data valid signal. Furthermore, the primary component can re-access the same secondary component before any previous requests are satisfied. The wait signal remains functional in the case that the secondary components buffer becomes filled with read requests. Data, in general, can be returned at a higher overall rate using variable latency.

According to various embodiments, data, control, and address lines including a data valid line supporting variable latency are automatically generated using a tool or generator program operable to configure a programmable chip. In some instances, a user can select, parameterize, and connect components automatically using the programmable chip tool. A user can select whether components should support fixed or variable latency and appropriate control lines are generated to support the desired configuration.

FIG. 7 is a diagrammatic representation showing implementation of an electronic device using a programmable chip tool. An input stage 701 receives selection information typically from a user for logic such as a processor core as well as other components such as a streaming output device to be implemented on an electronic device. In one example, the input received is in the form of a high-level language program. A generator program 705 creates a logic description and provides the logic description along with other customized logic to any of a variety of synthesis tools, place and route programs, and logic configuration tools to allow a logic description to be implemented on an electronic device.

In one example, an input stage 701 often allows selection and parameterization of components to be used on an electronic device. The input stage 701 also allows configuration of variable or fixed latency support. In some examples, components provided to an input stage include intellectual property functions, megafunctions, and intellectual property cores. The input stage 701 may be a graphical user interface using wizards for allowing efficient or convenient entry of information. The input stage may also be a text interface or a program reading a data file such as a spreadsheet, database table, or schematic to acquire selection information. The input stage 701 produces an output containing information about the various modules selected.

In typical implementations, the generator program 705 can identify the selections and generate a logic description with information for implementing the various modules. The generator program 705 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 705 identifies pointers and provides ports for each pointer. One tool with generator program capabilities is System on a Programmable Chip (SOPC) Builder available from Altera Corporation of San Jose, Calif. The generator program 705 also provides information to a synthesis tool 707 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 709.

As will be appreciated by one of skill in the art, the input stage 701, generator program 705, and synthesis tool 707 can be separate programs. The interface between the separate programs can be a database file, a log, or simply messages transmitted between the programs. For example, instead of writing a file to storage, the input stage 701 can send messages directly to the generator program 705 to allow the generator program to create a logic description. Similarly, the generator program can provide information directly to the synthesis tool instead of writing HDL files. Similarly, input stage 701, generator program 705, and synthesis tool 707 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 713, the synthesized netlist file can be provided to physical design tools 719 including place and route and configuration tools. A place and route tool typically locates logic cells on specific logic elements of a target hardware device and connects wires between the inputs and outputs of the various logic elements in accordance with logic required to implement an electronic design. The device can also be physically tested at 723.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 8:
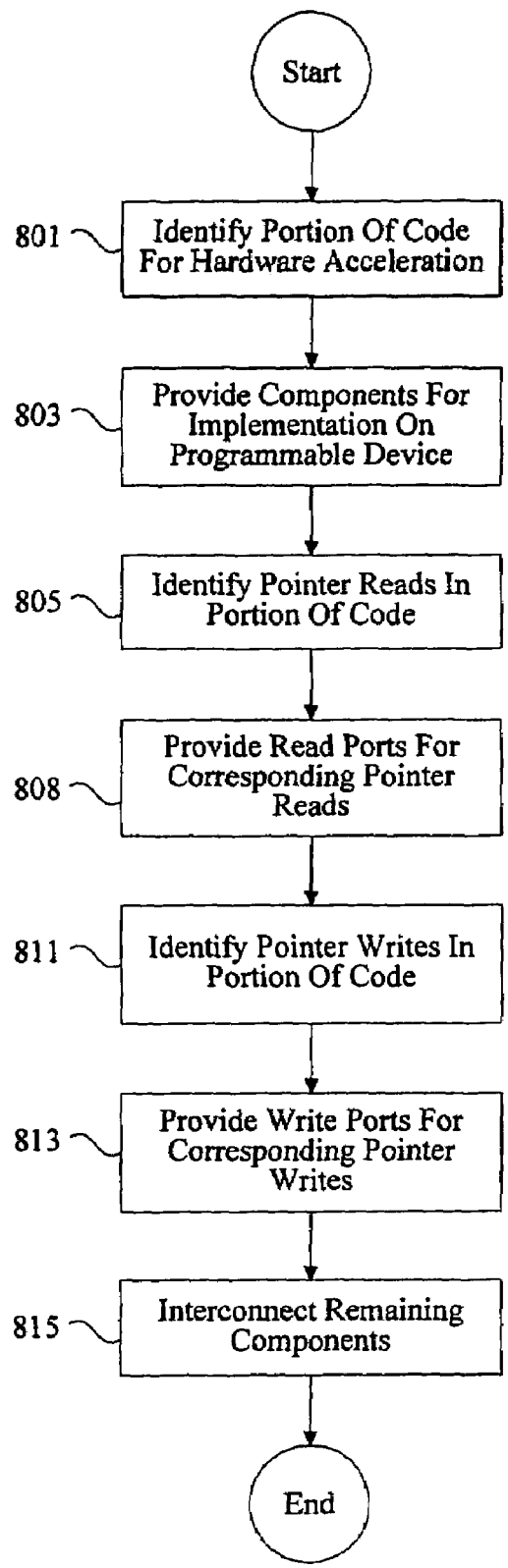
FIG. 8 is a process flow diagram showing a technique for generating a hardware accelerator.

FIG. 8 is a flow process diagram showing one technique for implementing a programmable device using high-level language code. At 801, the portion of code of a high-level language program is identified for hardware acceleration. It should be noted that a portion of code can include many disparate and disconnected lines in a software program, or even segments in different files. The generator program can identify the code for hardware acceleration in a variety of manners. In one example, inner loops that are run frequently are designated for hardware acceleration. In another example, a user specifies the type of code that should be configured for hardware acceleration. In yet another example, an available profiler or feedback tool is used to measure the performance of various instructions and provide information to a generator tool to identify a portion of code for hardware acceleration. At 803, components are provided for implementation on the programmable device.

In some examples, components are acquired from a library of components associated with a generator program. The components can include peripheral components and peripheral interfaces such as universal asynchronous receiver transmitters (UARTs), parallel input outputs (PIOs), timers, a streaming output devices, and memory. At 805, pointer reads are identified in the portion of code designated for hardware acceleration. According to various embodiments, pointers in the selected portion of code for hardware acceleration are configured by using specific logic and circuitry for handling pointers. In many conventional implementations, very limited pointer support is available. However, the techniques and mechanisms of the present invention allow robust handling of pointer referencing and dereferencing. In one example, pointer reads are handled by providing read ports associated with the hardware accelerator at 808.

At 811, pointer writes are identified in the portion of code configured for hardware acceleration at 813, write ports are provided for each corresponding pointer write. At 815, the components for implementation on the programmable device are interconnected. According to various embodiments, hardware accelerator read and write ports are connected to memory through an interconnection fabric. The hardware accelerator read and write ports have the same access to memory a processor core has.

Figure 9:
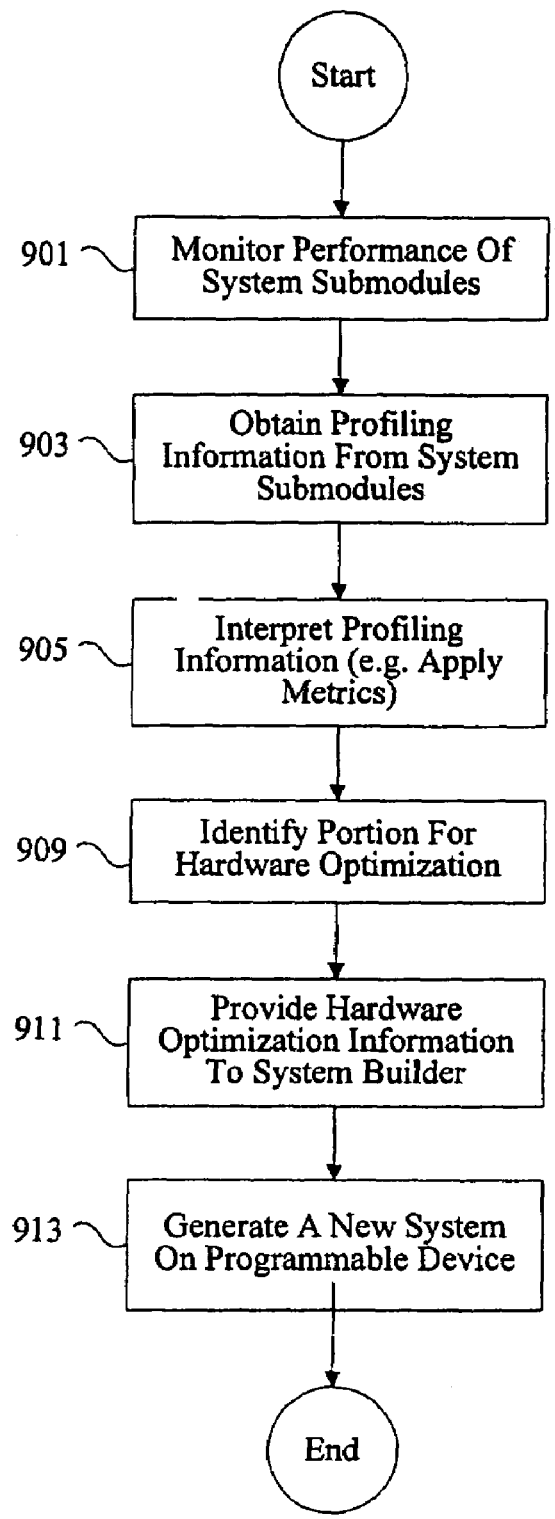
FIG. 9 is a process flow diagram showing profiling and feedback.

FIG. 9 is a flow process diagram showing one example of profiling and feedback used to identify the portion of the high-level language program for optimization. The profiling and feedback mechanism allows a system to monitor performance of instructions associated with program code and determines which portion should be optimized for acceleration in a subsequent implementation. Conventional profiling and feedback mechanisms are capable of monitoring system performance and providing optimization information. For example, profiling systems for software typically provide feedback to a user so that a user can modify or improve heavily used software subroutines. The techniques of the present invention contemplate using feedback information to automatically identify code in a software program for hardware acceleration. The feedback and profiling mechanisms of the present invention allow feedback to automatically modify a programmable chip without human intervention.

At 901, the performance of system submodules is monitored. According to various embodiments, the system is divided into submodules corresponding to various subroutines or process flows. In one example, the performance of inner loops is monitored. At 903, profiling information is obtained from the submodules. In one example, profiling information includes the average time taken to perform a particular subroutine as well as how often the subroutines run. At 905, profiling information is interpreted. Metrics can be used to interpret profiling information. For example, subroutines that are not run very often may be filtered from hardware acceleration. At 909, a portion of the high-level program is identified for hardware optimization. The portion identified may include the most frequently run lines of code that also have long processing times. Lines of code that are run frequently and slowly by a processor are often the best candidates for hardware acceleration. At 911, hardware optimization information is provided to a generator program such as a program used to implement components on a programmable device. At 913, a new system on a programmable device is generated.

Figure 10:
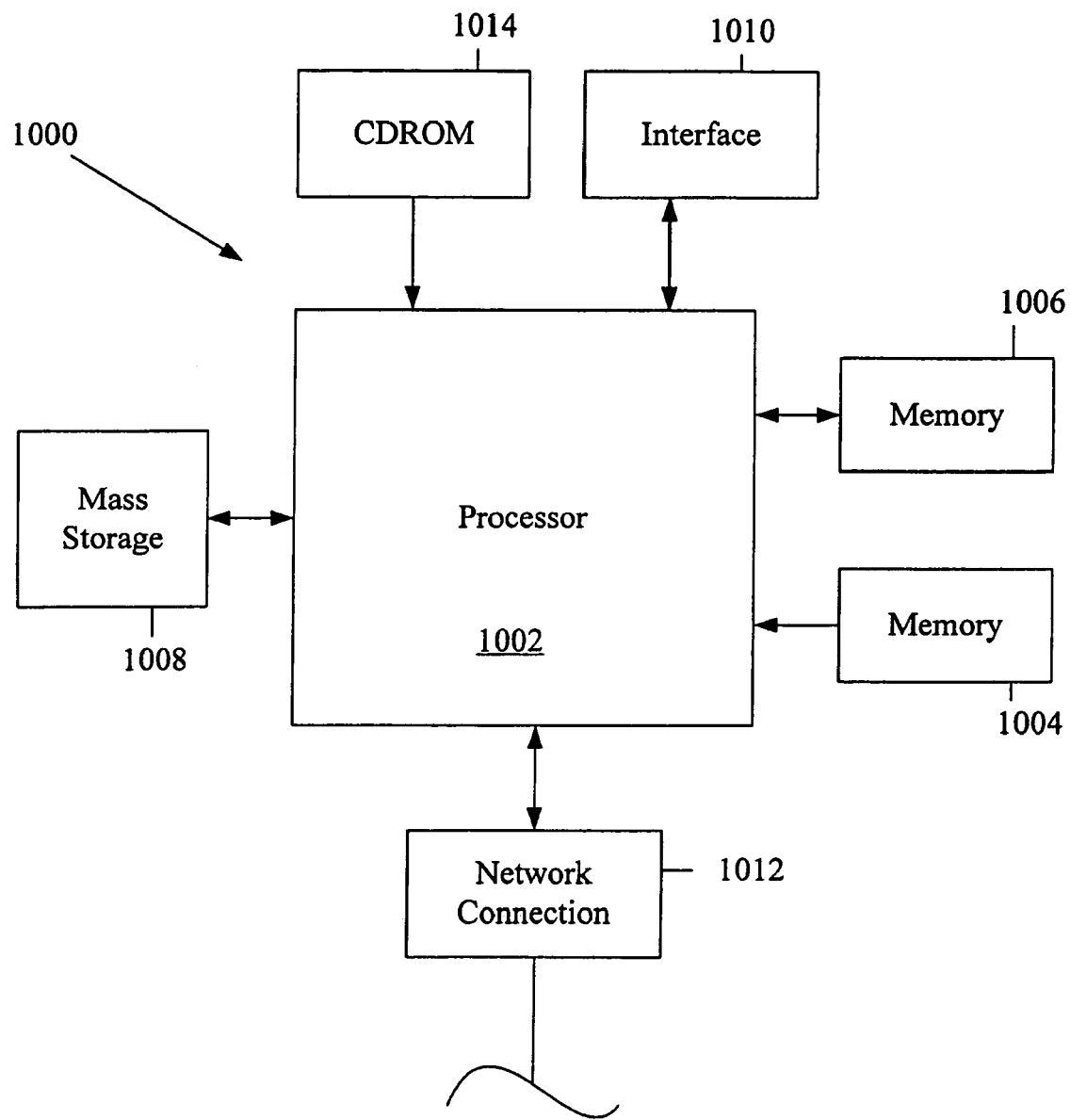
FIG. 10 is a diagrammatic representation depicting a computer system.

FIG. 10 illustrates a typical computer system that can be used to implement a programmable chip having shared I/O lines. The computer system 1000 includes any number of processors 1002 (also referred to as central processing units, or CPUs) that are coupled to devices including memory 1006 (typically a random access memory, or "RAM"), memory 1004 (typically a read only memory, or "ROM"). The processors 1002 can be configured to generate a test sequences for any designated processor. As is well known in the art, memory 1004 acts to transfer data and instructions uni-directionally to the CPU and memory 1006 is used typically to transfer data and instructions in a bi-directional manner.

Both of these memory devices may include any suitable type of the computer-readable media described above. A mass storage device 1008 is also coupled bi-directionally to CPU 1002 and provides additional data storage capacity and may include any of the computer-readable media described above. The mass storage device 1008 may be used to store programs, data and the like and is typically a secondary storage medium such as a hard disk that is slower than memory. The mass storage device 1008 can be used to hold a library or database of prepackaged logic or intellectual property functions, as well as information on generating particular configurations. It will be appreciated that the information retained within the mass storage device 1008, may, in appropriate cases, be incorporated in standard fashion as part of memory 1006 as virtual memory. A specific mass storage device such as a CD-ROM 1014 may also pass data uni-directionally to the CPU.

CPU 1002 is also coupled to an interface 1010 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 1002 optionally may be coupled to a computer or telecommunications network using a network connection as shown generally at 1012. With such a network connection, it is contemplated that the CPU might receive information from the network, or might output information to the network in the course of performing the above-described method steps. It should be noted that the system 1000 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 1008 or 1014 and executed on CPU 1008 in conjunction with primary memory 1006.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. Although shared I/O lines have been described in the context of a memory controller and a simultaneous multiple primary component switch fabric, shared I/O lines can be used in a system without a memory controller and/or without a simultaneous multiple primary component switch fabric. It is therefore intended that the invention be interpreted to include all variations and equivalents that fall within the true spirit and scope of the present invention.

What is claimed is:

1. A method for implementing a programmable device, the method comprising:

receiving high-level language code, the high-level language code configured to run on a conventional central processing unit;

generating hardware acceleration logic for performing the high-level language code on a programmable device, wherein the hardware acceleration logic is configured to perform pipelined execution of instructions using a plurality of execution stages, the hardware acceleration logic having access to an allocated region of memory, the hardware acceleration logic further having associated read and write ports for handling pointer referencing and dereferencing to addresses outside of the allocate region of memory;

coupling the hardware acceleration logic to memory to allow the hardware acceleration logic to access memory, wherein the number of stages included in the hardware acceleration logic is associated with the expected latency of memory access.

2. The method of claim 1, wherein the number of stages included in the hardware acceleration logic is associated with the maximum latency of memory access.

3. The method of claim 1, wherein the number of stages included in the hardware acceleration logic is equal to the maximum latency in clock cycles associated with memory access.

4. The method of claim 1, wherein generating hardware acceleration logic includes generating HDL.

5. The method of claim 1, wherein generating hardware acceleration logic includes generating a hardware acceleration component for implementation on the programmable device.

6. The method of claim 5, wherein memory is coupled to the hardware acceleration component through a buffer.

7. The method of claim 6, wherein the size of the memory is associated with the expected latency of memory access and the number of stages.

8. The method of claim 1, wherein generating hardware acceleration logic comprises identifying pointer read and write access in the high-level language code.

9. The method of claim 1, wherein generating hardware acceleration logic includes generating a hardware acceleration component for implementation on the programmable device.

10. The method of claim 9, providing the hardware acceleration logic with a write port for a pointer write access identified in the high-level language code.

11. The method of claim 10, wherein the write port includes a write address line having an address corresponding to the address of the pointer.

12. The method of claim 1, providing the hardware acceleration logic with a read port for a pointer read access identified in the high-level language code.

13. The method of claim 12, wherein the read port includes a read address line having an address corresponding to the address of the pointer.

14. The method of claim 9, wherein the hardware acceleration component is coupled to a simultaneous multiple primary component fabric.

15. The method of claim 1, wherein the central processing unit is a general purpose processor.

16. The method of claim 15, wherein the central processing unit supports a general purpose instruction set.

17. The method of claim 16, wherein the high-level language program is prepared in ANSI C.

18. The method of claim 1, wherein the profiling data is provided by a profiling and feedback tool to allow selection of high-level language code.

19. A programmable device, comprising:
a hardware acceleration component on a programmable device operable to implement high-level language code configured to run on a conventional central processing unit; wherein the hardware acceleration component is configured to perform pipelined execution of instructions using a plurality of execution stages, the hardware acceleration logic having access to an allocated region of memory, the hardware acceleration logic further having associated read and write ports for handling pointer referencing and dereferencing to addresses outside of the allocate region of memory;
memory coupled to the hardware acceleration component, wherein the number of execution stages is associated with the expected latency of memory access.

20. The programmable device of claim 19, wherein the number of stages included in the hardware acceleration component is associated with the maximum latency of memory access.

21. The programmable device of claim 19, wherein the number of stages included in the hardware acceleration component is equal to the maximum latency in clock cycles associated with memory access.

22. The programmable device of claim 19, wherein the hardware acceleration component is generated using HDL.

23. The programmable device of claim 22, wherein memory is coupled to the hardware acceleration component through a buffer.

24. The programmable device of claim 23, wherein the size of the memory is associated with the expected latency of memory access and the number of stages.

25. The programmable device of claim 19, wherein generating hardware acceleration logic comprises identifying pointer read and write access in the high-level language code.

26. A system for implementing a programmable device, the system comprising:
means for receiving high-level language code, the high-level language code configured to run on a conventional central processing unit;
means for generating hardware acceleration logic for performing the high-level language code on a programmable device, wherein the hardware acceleration logic is configured to perform pipelined execution of instructions using a plurality of execution stages, the hardware acceleration logic having access to an allocated region of memory, the hardware acceleration logic further having associated read and write ports for handling pointer referencing and dereferencing to addresses outside of the allocate region of memory;
means for coupling the hardware acceleration logic to a secondary component to allow the hardware acceleration logic to access the secondary component, wherein the number of stages included in the hardware acceleration logic is associated with the expected latency of secondary component access.

27. The system of claim 26, wherein the number of stages included in the hardware acceleration logic is associated with the maximum latency of the secondary component access.

28. The system of claim 26, wherein the number of stages included in the hardware acceleration logic is equal to the maximum latency in clock cycles associated with secondary component access.

29. The system of claim 26, wherein generating hardware acceleration logic includes generating HDL.

30. The system of claim 26, wherein generating hardware acceleration logic includes generating a hardware acceleration component for implementation on the programmable device.

* * * * *